United States Patent
Shu et al.

(10) Patent No.: US 11,106,256 B2
(45) Date of Patent: Aug. 31, 2021

(54) HEAT DISSIPATION USING AIRFLOW DIVERSION WITH COOLING FINS

(71) Applicant: Intel Corporation, Santa Clara, CA (US)

(72) Inventors: Tao Shu, Shanghai (CN); Chuansheng Liu, Shanghai (CN); Na Chen, Shanghai (CN); Liguang Du, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/648,595

(22) PCT Filed: Jan. 12, 2018

(86) PCT No.: PCT/CN2018/072410
§ 371 (c)(1),
(2) Date: Mar. 18, 2020

(87) PCT Pub. No.: WO2019/136696
PCT Pub. Date: Jul. 18, 2019

(65) Prior Publication Data
US 2020/0218317 A1   Jul. 9, 2020

(51) Int. Cl.
G06F 1/20 (2006.01)
F28D 15/02 (2006.01)
H05K 7/20 (2006.01)

(52) U.S. Cl.
CPC ........... *G06F 1/20* (2013.01); *F28D 15/0275* (2013.01); *H05K 7/20009* (2013.01);
(Continued)

(58) Field of Classification Search
CPC ... G06F 1/20; F28D 15/0275; H05K 7/20009; H05K 7/20336; H05K 7/2039; H05K 7/20727
See application file for complete search history.

(56) References Cited

U.S. PATENT DOCUMENTS 6,778,390 B2 * 8/2004 Michael ............... H01L 23/467
361/695
9,258,929 B2 * 2/2016 Zhang ............... H05K 7/20727
(Continued)

FOREIGN PATENT DOCUMENTS

CN   201226637 Y   4/2009
CN   102045989 A   5/2011
(Continued)

OTHER PUBLICATIONS

International Search Report and Written Opinion dated Oct. 12, 2018 for International Patent Application No. PCT/CN2018/072410, 10 pages.

*Primary Examiner* — Mukundbhai G Patel
(74) *Attorney, Agent, or Firm* — Schwabe, Williamson & Wyatt, P.C.

(57) ABSTRACT

Embodiments described herein may include apparatuses, systems and/or processes to provide cooling to a heat source. In embodiments, a first set of cooling fins are thermally coupled to a heat source in a first orientation to allow first airflow to pass through in between the first set of cooling fins to dissipate heat from the heat source. A second set of cooling fins thermally coupled to the heat source in a second orientation to allow second airflow to pass through in between the second set of cooling fins to dissipate heat from the heat source. A barrier may be coupled to the second set of cooling fins to substantially divert the second airflow away from the first airflow about to pass through in between the first set of cooling fins so that pre-heated air does not flow over the first set of cooling fins.

25 Claims, 5 Drawing Sheets

(52) U.S. Cl.
  CPC ....... *H05K 7/2039* (2013.01); *H05K 7/20336* (2013.01); *H05K 7/20727* (2013.01); *G06F 2200/201* (2013.01)

(56) References Cited

U.S. PATENT DOCUMENTS

| | | | |
|---|---|---|---|
| 2002/0185259 A1 | 12/2002 | Park | |
| 2004/0163795 A1* | 8/2004 | Lin | H01L 23/467 165/80.3 |
| 2008/0115914 A1* | 5/2008 | Yang | H01L 23/467 165/104.33 |

FOREIGN PATENT DOCUMENTS

| | | |
|---|---|---|
| CN | 102647880 A | 8/2012 |
| CN | 102789292 A | 11/2012 |

\* cited by examiner

US 11,106,256 B2

HEAT DISSIPATION USING AIRFLOW DIVERSION WITH COOLING FINS

CROSS REFERENCE TO RELATED APPLICATIONS

The present application is a national phase entry under 35 U.S.C. § 371 of International Application No. PCT/CN2018/072410, filed Jan. 12, 2018, entitled "HEAT DISSIPATION USING AIRFLOW DIVERSION WITH COOLING FINS", which designated, among the various States, the United States of America. The Specifications of the PCT/CN2018/072410 Application is hereby incorporated by reference.

FIELD

Embodiments of the present disclosure generally relate to the field of thermal management for electronic components. More specifically, embodiments of the present disclosure relate to heat sink cooling fin orientation and placement.

BACKGROUND

As computing capacity requirements continue to grow, particularly in the area of server systems, higher-performing central processing units (CPUs) and increased amounts of associated memory are being included on printed circuit boards (PCBs) creating increased thermal management challenges.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
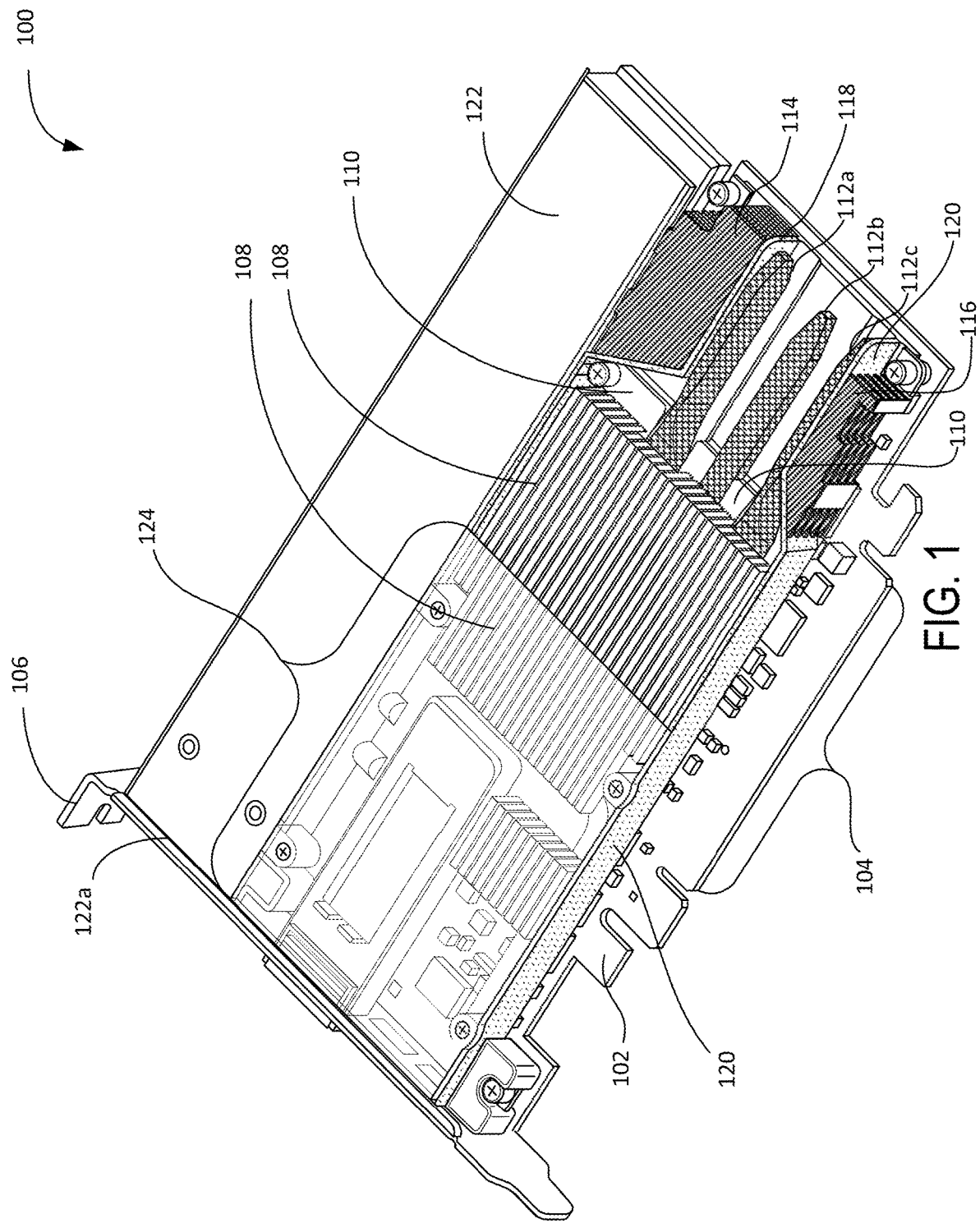
FIG. 1 illustrates a perspective view of an example implementation of a circuit board using airflow diversion for heat dissipation, in accordance with various embodiments.

With increased demand for computing systems with ever-greater amounts of active and passive components, these components may be placed closer together, for example, on a PCIe card. As a result, issues with respect to heat dissipation for complex circuit boards, such as the PCIe card, having passive thermal (heat) dissipation may become increasingly prevalent.

In embodiments herein, passive thermal dissipation may be enhanced by implementing a first set of cooling fins thermally coupled to a heat source in a first orientation to allow first airflow to pass through in between the first set of cooling fins to dissipate heat from the heat source. There may be a second set of cooling fins thermally coupled to the heat source in a second orientation to allow a second airflow to pass through in between the second set of cooling fins to dissipate heat from the heat source, where the first and second set of cooling fins are substantially adjacent to each other and disposed in a common plane, and wherein the first and second orientations are substantially orthogonal. There may be a barrier coupled to the second set of cooling fins to substantially divert the second airflow away from the first airflow about to pass through in between the first set of cooling fins.

In embodiments, this may allow heated air that has absorbed heat from the heat source passing along the first set of cooling fins to be diverted around the second set of cooling fins. In this way, the second set of cooling fins may receive cool air drawn in for thermal dissipation, resulting in increased heat dissipation from the heat source. In embodiments, fin distribution is refined and air flow is managed locally to prevent pre-heated air from being used to cool a high power processor or other component by grouping fins so that they operate in parallel instead of in series along an air flow path. The fin grouping may also create a pressure potential of air flow through the circuit board. In embodiments, this is a passive thermal approach to manage air flow to cool high power circuit boards or other components having a low profile form factor, for example components that may be operating at 60 watts thermal design power (TDP).

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "including," "having," and the like, as used with respect to embodiments of the present disclosure, are synonymous.

The terms "coupled with" and "coupled to" and the like may be used herein. "Coupled" may mean one or more of the following. "Coupled" may mean that two or more elements are in direct physical, thermal or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements or devices are thermally coupled. By way of example and not limitation, "coupled" may mean two or more elements/devices cooperate and/or interact. By way of example and not limitation, a computing apparatus may include two or more computing devices "coupled" on a motherboard or by one or more network linkages.

FIG. 1 illustrates a perspective view of an example implementation of a circuit board using airflow diversion for heat dissipation, in accordance with various embodiments. Diagram 100 may show a PCIe card that includes a printed circuit board (PCB) 102 that may have a motherboard connector area 104. The PCB 102 may be connected with an attachment bracket 106 that may allow securing the PCIe card 100 to a chassis (not shown). While for ease of understanding, the remaining description may be presented in the context of a PCIe card, it is noted the present disclosure is not so limiting, and may be practiced with any circuit board with complex thermal challenges.

A set of vertical fins 108 may be thermally coupled with a heat sink 110 (see also heat sink 210 of FIG. 2) to transfer heat generated by the operation of the PCIe card 102 to ambient air. In embodiments, the vertical fins 108 may be directly coupled with the heat sink 110, may be part of the heat sink 110, or may have a heat pipe (not shown) that may thermally couple the vertical fins 108 with the heat sink 110. During operation of the PCIe card 100, when at temperature, air may be drawn in and across vertical fins 108 and exit out the front of the PCIe card 100 proximate to the attachment bracket 106.

Heat pipes 112a-112c may be thermally coupled with the heat sink 110. In embodiments, the heat pipes 112a-112c may be thermally coupled with horizontal fin stacks 114, 116 to route thermal energy from the heat sink 110 to the horizontal fin stacks 114, 116. The heat pipes 112a, 112c may be thermally coupled to a wall 118, 120 that may provide an air separation or barrier between air that may have entered the horizontal fin stacks 114, 116 and the air that may enter the vertical fins 108. In embodiments, the wall 118, 120 may provide airflow diversion.

In embodiments, air from a horizontal fin stack 114 warmed by thermal conductivity from the heat sink 110, may enter an air duct 122. In embodiments, this air duct may be isolated from the vertical fins 108. In this way, air within the air duct 122 may exit at an air duct opening 122a. Thus, the air warmed by the horizontal fin stack 114 may be expelled by the air duct 122 through the air duct opening 122a without encountering the vertical fins 108.

Similarly, in embodiments, air from a horizontal fin stack 116 warmed by thermal conductivity from the heat sink 110 may be expelled on a side of the wall 120 that is opposite of the vertical fins 108. In embodiments, this air, rather than encountering vertical fins 108, may exit and join the ambient air within the chassis (not shown) in which the PCIe card 100 is located.

Figure 3:
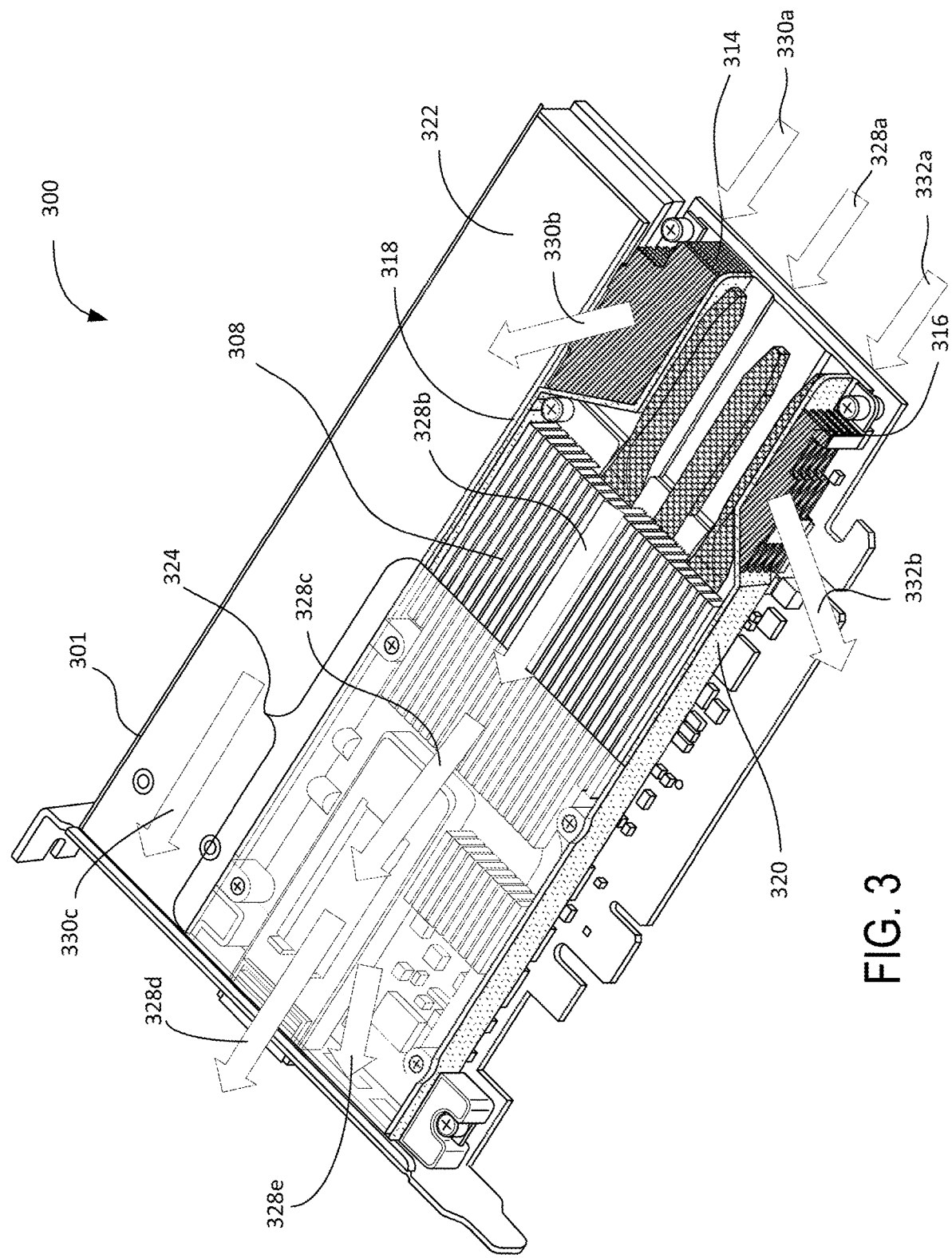
FIG. 3 illustrates a perspective view of airflow through an example implementation of a PCIe card using airflow diversion for heat dissipation, in accordance with various embodiments.

As a result, during operation when the PCIe card 100 is at temperature, an air flow pattern, described in more detail in FIG. 3, may develop such that air heated by the horizontal fin stacks 114, 116 is redirected away from entering vertical fins 108. As a result, cool air is able to enter vertical fins 108. As a result, with a combination of vertical fins 108 and horizontal fin stacks 114, 116, a greater fin surface area may be available for contact with cooler air to increase the efficiency of thermal transfer from the heat sink 110 to the air passing through the vertical fins 108 and the horizontal fin stacks 114, 116.

In embodiments, a cover 124 may be placed above of all or part of the vertical fins 108. In embodiments, the cover 124 may extend between the walls 118, 120, and may extend to the edge of the PCIe card 100 proximate to the attachment bracket 106. This cover 124 may be placed to facilitate airflow across the vertical fins 108 and across the horizontal fin stacks 114, 116 when the PCIe card 100 is operating at temperature.

Figure 2:
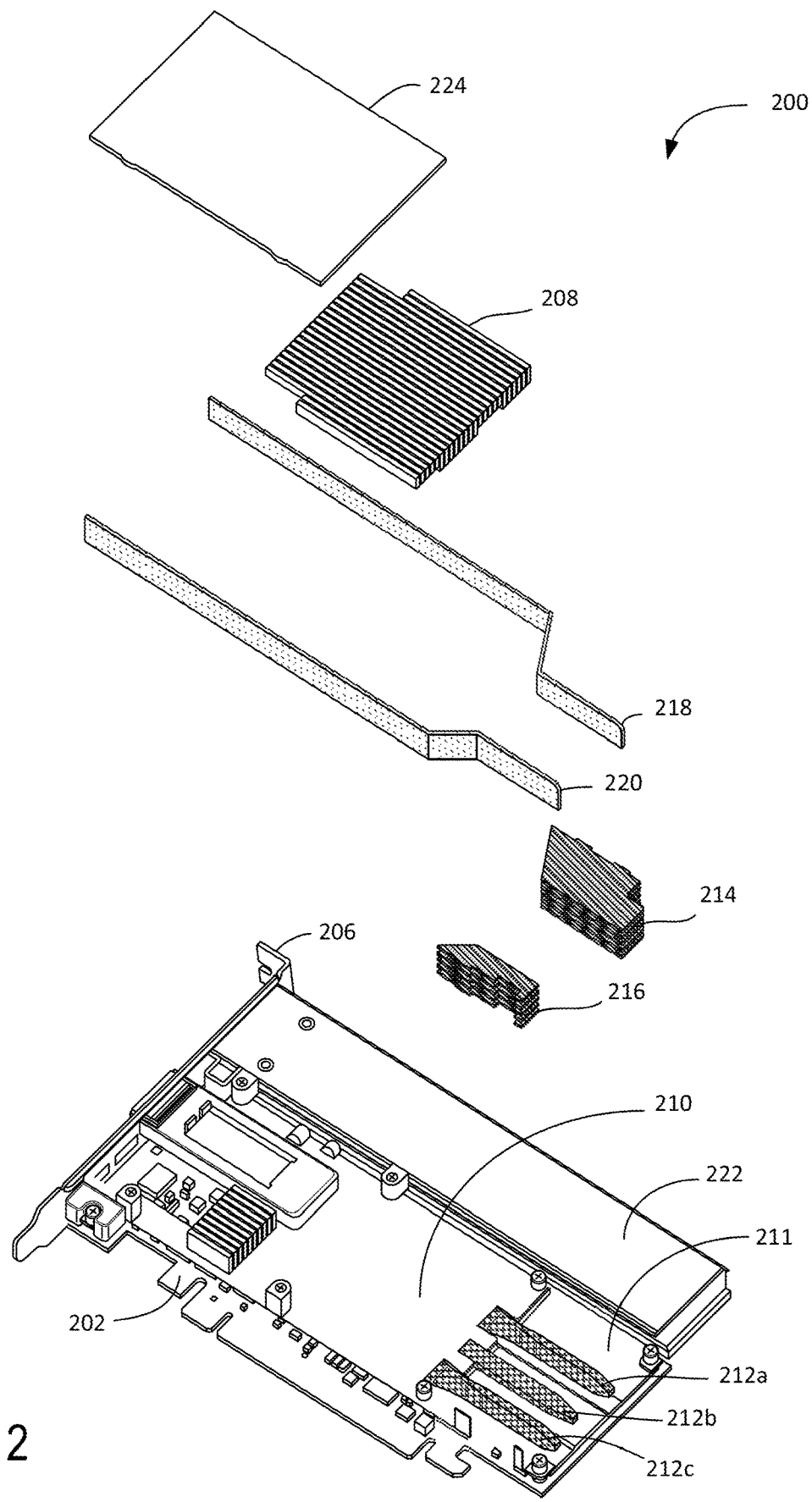
FIG. 2 illustrates an explosion view of components of an example implementation of a peripheral component interface express (PCIe) card using airflow diversion for heat dissipation, in accordance with various embodiments.

FIG. 2 illustrates an explosion view of components of an example implementation of a PCIe card using airflow diversion for heat dissipation, in accordance with various embodiments. Diagram 200 shows a PCIe card, which may be similar to PCIe card 100 of FIG. 1, with various components broken out in an explosion diagram view.

The heat sink 210, which may be similar to heat sink 110 of FIG. 1, may be thermally coupled to one or more components (not shown) that may be coupled to the PCB 202, which may be similar to PCB 102 of FIG. 1. The operation of these components (not shown) may generate thermal energy (heat) that is transferred to the heat sink 210 to be dissipated during operation. Vertical fins 208 may be attached to the heat sink 210 to allow thermal energy to more easily be transferred to ambient air. In addition, the vertical fins 208 may cause a pressure differential of a lower pressure air around the vertical fins 208 when the heat sink 210 is at temperature, and may cause a flow of ambient air toward the fins 208. This is discussed further with respect to FIG. 3.

Heat pipes 212a-212c, which may be similar to heat pipes 112a-112c of FIG. 1, may transfer thermal energy away from the heat sink 210. In embodiments, this thermal energy may be transferred to horizontal fin stacks 214, 216, which may be similar to horizontal fin stacks 114, 116 of FIG. 1. The heat pipes 212a-212c may be hollow metal pipes filled with a liquid coolant that moves heat by evaporating and condensing in an endless cycle. In embodiments, heat pipes 212a-212c may be implemented by a solid thermally conductive substance such as aluminum or other thermal conductor.

The heat pipes 212a-212c may thermally connect to the horizontal fin stacks 214, 216 via a direct connection (not shown), a thermal plate 211, or through some other mechanism. In embodiments, the heat pipes may be connected to one or more walls 218, 230 that may be in turn thermally connected with the horizontal fin stacks 214, 216. In embodiments, the horizontal fin stacks 214, 216 may be at a distance from the heat sink 110. During operation, air taken into the horizontal fin stacks 214, 216 will be heated and then exhausted through the air duct 222, which may be similar to the air duct 122 of FIG. 1.

In embodiments, the walls 218, 220 may be formed along the heat sink 210 to isolate preheated airflow through the horizontal fin stacks 214, 216 so that this preheated air does not flow over the vertical fins 208. In embodiments, the walls 218, 220 may be made of a metal such as aluminum, of substrate material, or of any other suitable material that may resist airflow through the material.

A cover 224, which may be similar to cover 124 of FIG. 1, may be placed on top of and partially covering a portion of vertical fins 208. The cover 224 may also cover a part of the walls 218, 220. In embodiments, the cover 224 may facilitate thermal airflow across the vertical fins 208 by intensifying the air pressure potential difference due to the heating of the air by the vertical fins 208.

FIG. 3 illustrates a perspective view of airflow through an example implementation of a PCIe card using airflow diversion for heat dissipation, in accordance with various embodiments. Diagram 300 shows an example of a PCIe card 301, which may be similar to PCIe card 100 of FIG. 1 or PCIe card 200 of FIG. 2.

As discussed above, the vertical fins 308 and the cover 324, which may be similar to vertical fins 108 and the cover 124 of FIG. 1, may cause a low pressure area to form when the vertical fins 308 are heated through operation of the PCIe card 301. As a result, ambient air 328a may enter the PCIe card 301, absorb heat from the vertical fin 308 as the warm air 328b passes over the vertical fins 308, and may be expelled from the front of the PCIe card 301 as warmed air 328c-328e. Note that the ambient air 328a is cool air taken in from the chassis (not shown) that has not been preheated.

Ambient air 330a may flow the crossed the horizontal fin stack 314, which may be similar to horizontal fin stack 114 of FIG. 1. The air 330b may be warmed as it flows through the horizontal fin stack 314, may be redirected by the wall 318, which may be similar to the wall 218 of FIG. 2, and then may enter into the air duct 322, which may be similar to the air duct 122 of FIG. 1. The air 330c may then be expelled from the air duct 322 at the front of the PCIe card 301. It should be noted that the redirection by the wall 318 may prevent the warmed air 330b from flowing across the vertical fins 308. It should also be noted that the incoming air 328a, 330a, 332a may be drawn into the PCIe 301 card due to the air currents generated by the warmed air flow 328b-328e.

Similar to the airflow 330a described above, airflow 332a may be drawn into the horizontal fin stack 316, which may be similar to horizontal fin stack 116 of FIG. 1. As a result, warmed air 332b that has passed through the horizontal fin stack 316 may be redirected by wall 320, which may be similar to wall 120 of FIG. 1, to the ambient air within the chassis (not shown).

In embodiments, there may be a number of different configurations of the various components as described above. For example, there may be one, or more than one wall 318 that may be used to direct heated airflow away from one or more heat dissipation components. Furthermore, the orientations of the fins as described above with respect to the vertical fins 308 and the horizontal fin stacks 314, 316, may be in one or more different orientations, or may be in the same orientation.

Figure 4:
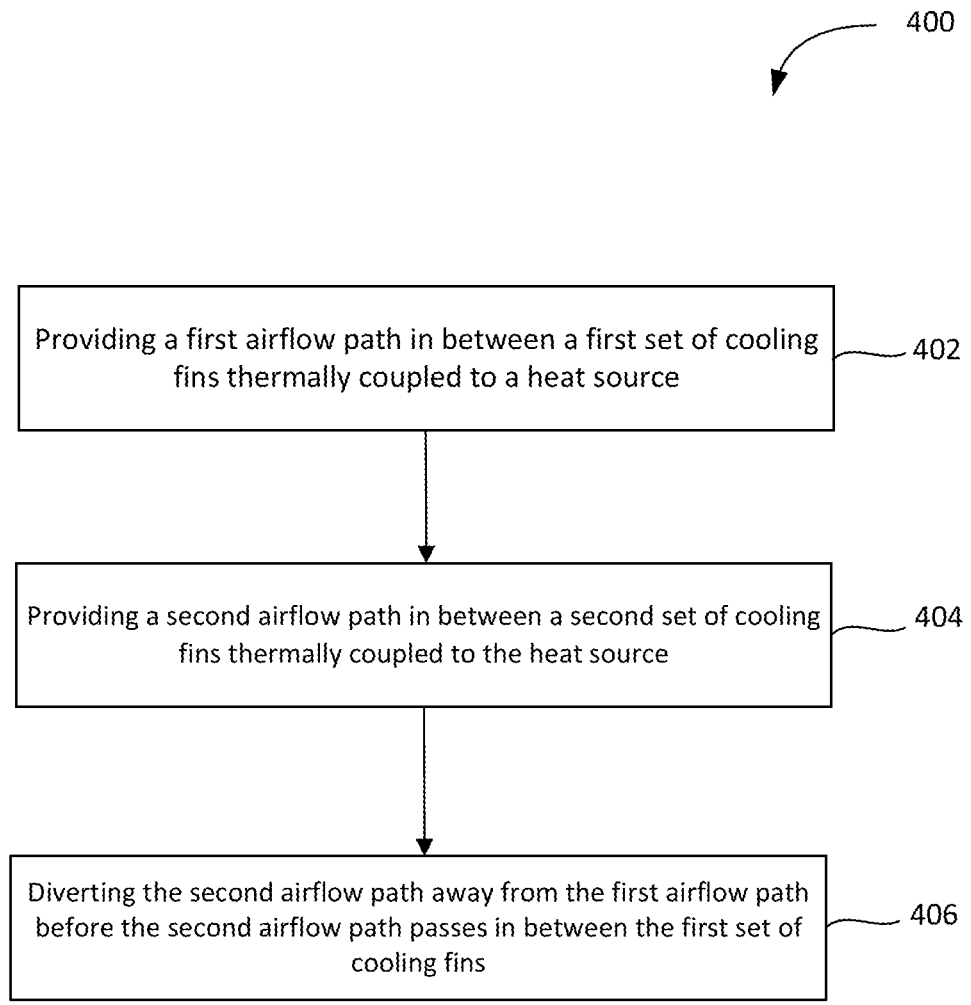
FIG. 4 depicts an example flow diagram showing a process 400 for cooling a heat source, in accordance with various embodiments.

FIG. 4 depicts an example flow diagram showing a process 400 for cooling a heat source, in accordance with various embodiments. The process 400 may be implemented by the PCIe card 100 of FIG. 1, 200 of FIG. 2, or 301 of FIG. 3.

At block 402, process may include providing a first airflow path in between a first set of cooling fins thermally coupled to a heat source. In embodiments, the first airflow path may correspond to airflows 328a-328e of FIG. 3. The air may flow across vertical fins 308 coupled to heat source 210 and the air may become warmer due to heat transfer. The warmed air may then proceed to exit the PCIe card 301 at airflows 328d, 328e. In embodiments, this airflow may be accelerated by the placement of a cover 324 that may partially or completely cover the vertical fins 308 to increase an air pressure differential. A source of air for the first airflow path may come from the ambient air 328a within the chassis (not shown) into which the PCIe card 301 may be placed.

At block 404, the process may include providing a second airflow path in between a second set of cooling fins thermally coupled to the heat source. In embodiments, the second airflow path may correspond to airflows 330a-330c or airflows 332a-332b of FIG. 3. The air may flow across horizontal fin stacks 314, 316 coupled to a heat source 210 and the air may become warmer due to heat transfer. The warmed air may then proceed to exit the PCIe card 301 at airflows 330b, 330c or at airflows 332b.

At block 406, the process may include diverting the second airflow path away from the first airflow path before the second airflow path passes in between the first set of cooling fins. In embodiments, the diversion may be accomplished by one or more walls 316, 318 that may separate the airflow path 328a-328e and the airflow path 330a-330c. In this way, the air that has been warmed by flowing through horizontal fin stacks 314, 316 will not pass through the vertical fins 308. As a result, only cooler air 328a will flow across vertical fins 308. In this way, the different airflows may operate in a parallel manner to increase cooling of the heat sink 210.

Various operations are described as multiple discrete operations in turn, in a manner that is most helpful in understanding the claimed subject matter. However, the order of description should not be construed as to imply that these operations are necessarily order dependent.

Figure 5:
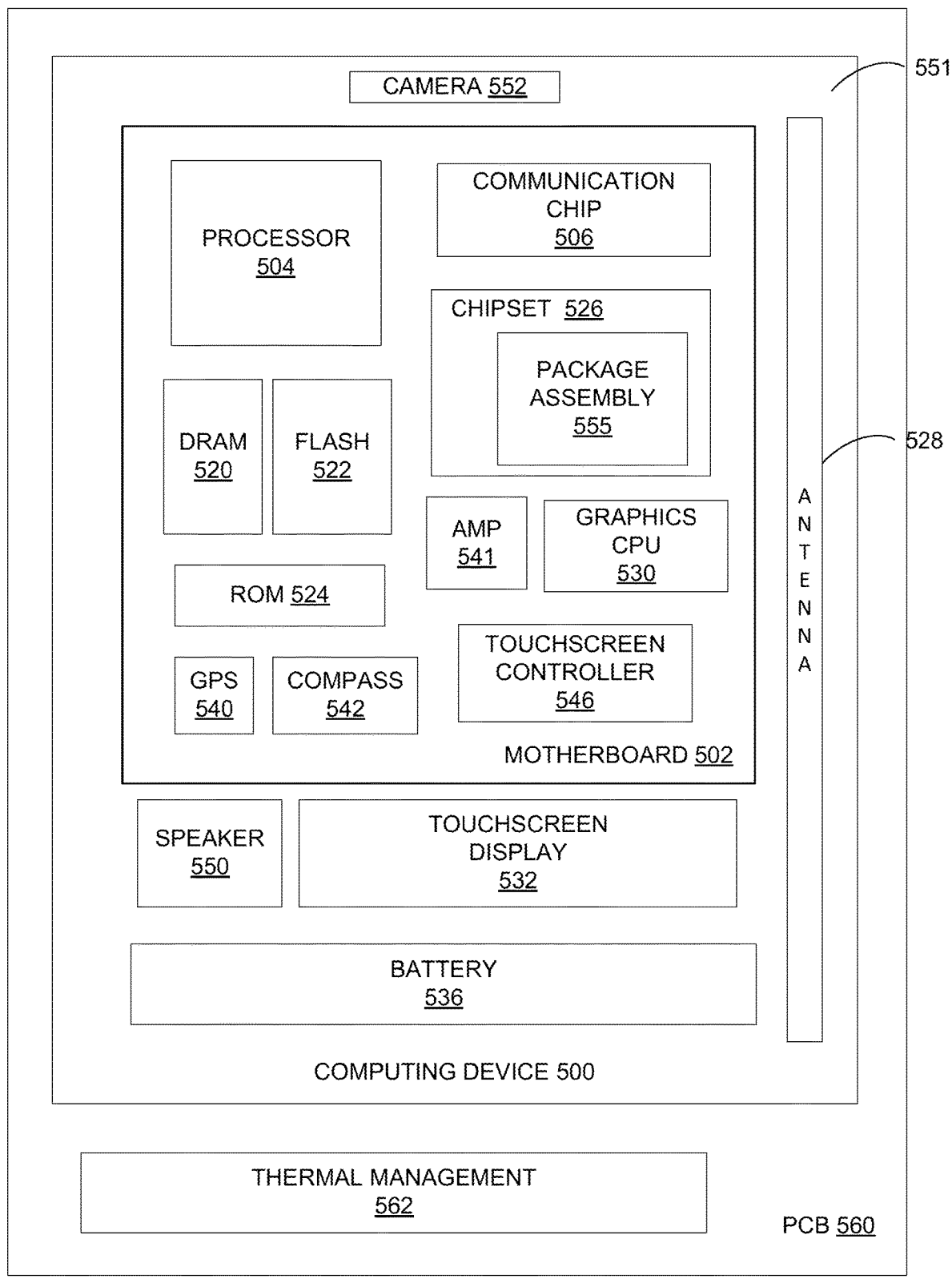
FIG. 5 schematically illustrates a computing device 400 in accordance with one embodiment.

Embodiments of the present disclosure may be implemented into a system using any suitable hardware and/or software to configure as desired. FIG. 5 schematically illustrates a computing device 500 in accordance with one embodiment. The computing device 500 may be on a PCB 560 that may include thermal management 562 that practices the airflow techniques of the present disclosure.

The computing device 500 may house a board such as motherboard 502 (i.e., housing 551). The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM) 520, non-volatile memory (e.g., ROM) 524, flash memory 522, a graphics processor 530, a digital signal processor (not shown), a crypto processor (not shown), a chipset 526, an antenna 528, a display (not shown), a touchscreen display 532, a touchscreen controller 546, a battery 536, an audio codec (not shown), a video codec (not shown), a power amplifier 541, a global positioning system (GPS) device 540, a compass 542, an accelerometer (not shown), a gyroscope (not shown), a speaker 550, a camera 552, and a mass storage device (such as hard disk drive, compact disk (CD), digital versatile disk (DVD), and so forth) (not shown). Further components, not shown in FIG. 5, may include a microphone, a filter, an oscillator, a pressure sensor, or an RFID chip. In embodiments, one or more of the package assembly components 555 may be a package assembly.

The communication chip 506 may enable wireless communications for the transfer of data to and from the computing device 500. The term "wireless" and its derivatives may be used to describe circuits, devices, systems, processes, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, EV-DO, and others.

The processor 504 of the computing device 500 may include a die in a package assembly. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an Ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, a digital video recorder, a PCIe board or some other circuit board. In further implementations, the computing device 500 may be any other electronic device that processes data, for example, an all-in-one device such as an all-in-one fax or printing device.

EXAMPLES

Example 1 may be an apparatus for cooling, comprising: a first set of cooling fins thermally coupled to a heat source in a first orientation to allow first airflow to pass through in between the first set of cooling fins to dissipate heat from the heat source; a second set of cooling fins thermally coupled to the heat source in a second orientation to allow a second airflow to pass through in between the second set of cooling fins to dissipate heat from the heat source, wherein the first and second set of cooling fins are substantially adjacent to each other and disposed in a common plane, and wherein the first and second orientations are substantially orthogonal; and a barrier coupled to the second set of cooling fins to substantially divert the second airflow away from the first airflow about to pass through in between the first set of cooling fins.

Example 2 may include the subject matter of example 1, wherein the barrier is a first barrier; and further comprising a second barrier coupled with at least a portion of a top of the first set of cooling fins and extending beyond the top of the first set of cooling fins to facilitate the first and second airflow respectively passing through in between the first and second sets of cooling fins.

Example 3 may include the subject matter of example 1, wherein the second set of cooling fins is thermally coupled to the heat source by one or more heat pipes.

Example 4 may include the subject matter of example 1, wherein the barrier coupled to the second set of cooling fins is further to divert the second airflow into an air duct.

Example 5 may include the subject matter of example 1, further comprising: a third set of cooling fins thermally coupled to the heat source in the second orientation to allow a third airflow to pass through in between the third set of cooling fins to dissipate heat from the heat source, wherein the first, second, and third sets of cooling fins are substantially disposed in a common plane.

Example 6 may include the subject matter of of any one of the examples 1-5, wherein the heat source is a PCIe card.

Example 7 may include the subject matter of example 6, wherein the first orientation of cooling fins are perpendicular to the PCIe card and the second orientation of cooling fins are parallel to the PCIe card.

Example 8 may include the subject matter of example 6, wherein the cooling fins include aluminum.

Example 9 may be a method for cooling, comprising: providing a first airflow path in between a first set of cooling fins thermally coupled to a heat source; providing a second airflow path in between a second set of cooling fins thermally coupled to the heat source; and diverting the second airflow path away from the first airflow path before the second airflow path passes in between the first set of cooling fins.

Example 10 may include the subject matter of example 9, wherein the first set of cooling fins are in a first orientation, and the second set of cooling fins are in a second orientation substantially orthogonal to the first orientation.

Example 11 may include the subject matter of example 9, wherein the second set of cooling fins is thermally coupled to the heat source by one or more heat pipes.

Example 12 may include the subject matter of example 9, wherein diverting the second airflow path further includes diverting the second airflow path using a barrier coupled to the second set of cooling fins.

Example 13 may include the subject matter of example 12, wherein diverting the second airflow path further includes diverting the second airflow path into an air duct.

Example 14 may include the subject matter of example 9, further comprising a third airflow path in between a third set of cooling fins thermally coupled to the heat source; and diverting the third airflow path away from the first airflow path before the third airflow path passes in between the first set of cooling fins.

Example 15 may include the subject matter of any one of examples 9-14, wherein the heat source is a PCIe card.

Example 16 may include the subject matter of example 15, wherein the first orientation of cooling fins are perpendicular to the PCIe card and the second orientation of cooling fins are parallel to the PCIe card.

Example 17 may include the subject matter of example 15, wherein the cooling fins include aluminum.

Example 18 may be an apparatus for cooling, comprising: means for providing a first airflow path in between a first set of cooling fins thermally coupled to a heat source; means for providing a second airflow path in between a second set of cooling fins thermally coupled to the heat source; and means for diverting the second airflow path away from the first airflow path before the second airflow path passes in between the first set of cooling fins.

Example 19 may include the subject matter of example 18, wherein the first set of cooling fins are in a first orientation, and the second set of cooling fins are in a second orientation substantially orthogonal to the first orientation.

Example 20 may include the subject matter of example 18, wherein the second set of cooling fins is thermally coupled to the heat source by one or more heat pipes.

Example 21 may include the subject matter of example 18, wherein means for diverting the second airflow path further includes means for diverting the second airflow path using a barrier coupled to the second set of cooling fins.

Example 22 may include the subject matter of example 21, wherein means for diverting the second airflow path further includes means for diverting the second airflow path into an air duct.

Example 23 may include the subject matter of example 18, further comprising a third airflow path in between a third set of cooling fins thermally coupled to the heat source; and means for diverting the third airflow path away from the first airflow path before the third airflow path passes in between the first set of cooling fins.

Example 24 may include the subject matter of any one of claims 18-23, wherein the heat source is a PCIe card.

Example 25 may include the subject matter of example 24, wherein the first orientation of cooling fins are perpendicular to the PCIe card and the second orientation of cooling fins are parallel to the PCIe card.

Example 26 may include the subject matter of example 24, wherein the cooling fins include aluminum.

Example 27 may include a system for cooling, comprising: a heat source on a printed circuit board (PCB); and a cooling apparatus, comprising: a first set of cooling fins thermally coupled to the heat source in a first orientation to allow first airflow to pass through in between the first set of cooling fins to dissipate heat from the heat source; a second set of cooling fins thermally coupled to the heat source in a second orientation to allow a second airflow to pass through in between the second set of cooling fins to dissipate heat from the heat source, wherein the first and second set of cooling fins are substantially adjacent to each other and disposed in a common plane, and wherein the first and second orientations are substantially orthogonal; and a barrier coupled to the second set of cooling fins to substantially divert the second airflow away from the first airflow about to pass through in between the first set of cooling fins.

Example 28 may include the subject matter of example 27, wherein the barrier is a first barrier; and further comprising a second barrier coupled with at least a portion of a top of the first set of cooling fins and extending beyond the top of the first set of cooling fins to facilitate the first and second airflow respectively passing through in between the first and second sets of cooling fins.

Example 29 may include the subject matter of example 27, wherein the second set of cooling fins is thermally coupled to the heat source by one or more heat pipes.

Example 30 may include the subject matter of example 27, wherein the barrier coupled to the second set of cooling fins is further to divert the second airflow into an air duct.

Example 31 may include the subject matter of example 27, further comprising: a third set of cooling fins thermally coupled to the heat source in the second orientation to allow a third airflow to pass through in between the third set of cooling fins to dissipate heat from the heat source, wherein the first, second, and third sets of cooling fins are substantially disposed in a common plane.

Example 32 may include the subject matter of any one of examples 27-31, wherein the heat source is a PCIe card.

Example 33 may include subject matter of example 32, wherein the first orientation of cooling fins are perpendicular to the PCIe card and the second orientation of cooling fins are parallel to the PCIe card.

Example 34 may include the subject matter of example 32, wherein the cooling fins include aluminum.

The foregoing description of one or more implementations provides illustration and description, but is not intended to be exhaustive or to limit the scope of the embodiments to the precise form disclosed or claimed herein. Modifications and variations are possible in light of the above teachings or may be acquired from practice of various implementations of the various embodiments. Future improvements, enhancements, or changes to particular components, methods, or means described in the various embodiments are contemplated to be within the scope of the claims and embodiments described herein, as would readily be understood by a person having ordinary skill in the art.

What is claimed is:
1. An apparatus for cooling, comprising:
a first set of cooling fins thermally coupled to a heat source to allow a first airflow to pass through in between the first set of cooling fins to dissipate heat from the heat source;
a second set of cooling fins thermally coupled to the heat source to allow a second airflow to pass through in between the second set of cooling fins to dissipate heat from the heat source, wherein the first and second set of cooling fins are substantially adjacent to each other and disposed in a common plane;
a wall coupled to the second set of cooling fins, wherein the wall is positioned between the first set of cooling fins and the second set of cooling fins to separate an airflow into the first airflow flowing over the first set of cooling fins and the second airflow flowing over the second set of cooling fins, wherein the first airflow and the second airflow are separate and distinct airflows, and wherein the second set of cooling fins extend substantially perpendicularly from the wall.

2. The apparatus of claim 1, further comprising a barrier coupled with at least a portion of a top of the first set of cooling fins and extending beyond the top of the first set of cooling fins to facilitate the first airflow passing through the first set of cooling fins.

3. The apparatus of claim 1, wherein the second set of cooling fins is thermally coupled to the heat source by one or more heat pipes.

4. The apparatus of claim 1, wherein the wall coupled to the second set of cooling fins is further to divert the second airflow into an air duct.

5. The apparatus of claim 1, further comprising:
a third set of cooling fins thermally coupled to the heat source to allow a third airflow to pass through in between the third set of cooling fins to dissipate heat from the heat source;
a second wall coupled to the third set of cooling fins, wherein the second wall is positioned between the third set of cooling fins and the first set of cooling fins to separate the third airflow from the second airflow, wherein the first airflow and the third airflow are separate and distinct airflows; and
wherein the first, second, and third sets of cooling fins are substantially disposed in a common plane.

6. The apparatus of claim 5, wherein the first set of cooling fins is substantially orthogonal to the third set of cooling fins.

7. The apparatus of claim 1, wherein the heat source is a PCIe card.

8. The apparatus of claim 7, wherein the first orientation of cooling fins are perpendicular to the PCIe card and the second orientation of cooling fins are parallel to the PCIe card.

9. The apparatus of claim 7, wherein the cooling fins include aluminum.

10. The apparatus of claim 1, wherein an orientation of the first set of cooling fins is substantially orthogonal to the second set of cooling fins.

11. A method for cooling, comprising:
providing a first airflow path in between a first set of cooling fins thermally coupled to a heat source;
providing a second airflow path in between a second set of cooling fins thermally coupled to the heat source; and
diverting the second airflow path away from the first airflow path before the second airflow path passes in between the first set of cooling fins using a wall positioned between the first set of cooling fins and the second set of cooling fins to separate the first airflow and the second airflow, and wherein the second set of cooling fins extend substantially perpendicularly from the wall.

12. The method of claim 11, wherein the first set of cooling fins are in a first orientation, and the second set of cooling fins are in a second orientation substantially orthogonal to the first orientation.

13. The method of claim 11, wherein the second set of cooling fins is thermally coupled to the heat source by one or more heat pipes.

14. The method of claim 11, wherein diverting the second airflow path further includes diverting the second airflow path into an air duct.

15. The method of claim 11, further comprising a third airflow path in between a third set of cooling fins thermally coupled to the heat source; and
diverting the third airflow path away from the first airflow path using a second wall coupled to the third set of cooling fins, wherein the second wall is positioned between the third set of cooling fins and the first set of cooling fins to separate the third airflow from the first airflow before the third airflow path passes in between the first set of cooling fins.

16. An apparatus for cooling, comprising:
means for providing a first airflow path in between a first set of cooling fins thermally coupled to a heat source;
means for providing a second airflow path in between a second set of cooling fins thermally coupled to the heat source; and
means for diverting the second airflow path away from the first airflow path before the second airflow path passes in between the first set of cooling fins using a wall positioned between the first set of cooling fins and the second set of cooling fins to separate the first airflow and the second airflow, and wherein the second set of cooling fins extend substantially perpendicularly from the wall.

17. The apparatus of claim 16, wherein the first set of cooling fins are in a first orientation, and the second set of cooling fins are in a second orientation substantially orthogonal to the first orientation.

18. The apparatus of claim 16, wherein the second set of cooling fins is thermally coupled to the heat source by one or more heat pipes.

19. The apparatus of claim 16, wherein means for diverting the second airflow path further includes means for diverting the second airflow path into an air duct.

20. The apparatus of claim 16, further comprising a third airflow path in between a third set of cooling fins thermally coupled to the heat source; and
means for diverting the third airflow path away from the first airflow path before the third airflow path passes in between the first set of cooling fins using a second wall coupled to a third set of cooling fins, wherein the second wall is positioned between the third set of cooling fins and the first set of cooling fins to separate the third airflow from the second airflow.

21. The apparatus of claim 16, wherein the heat source is a PCIe card.

22. The apparatus of claim 16, wherein the cooling fins include aluminum.

23. A system for cooling, comprising:
a heat source on a printed circuit board (PCB); and
a cooling apparatus, comprising:
a first set of cooling fins thermally coupled to the heat source in a first orientation to allow first airflow to pass through in between the first set of cooling fins to dissipate heat from the heat source;
a second set of cooling fins thermally coupled to the heat source in a second orientation to allow a second airflow to pass through in between the second set of cooling fins to dissipate heat from the heat source, wherein the first and second set of cooling fins are substantially adjacent to each other and disposed in a common plane, and wherein the first and second orientations are substantially orthogonal; and
a wall coupled to the second set of cooling fins, wherein the wall is positioned between the first set of cooling fins and the second set of cooling fins to separate an airflow into the first airflow flowing over the first set of cooling fins and the second airflow flowing over the second set of cooling fins, and wherein the second set of cooling fins extend substantially perpendicularly from the wall.

24. The system of claim 23, further comprising a second barrier coupled with at least a portion of a top of the first set of cooling fins and extending beyond the top of the first set of cooling fins to facilitate the first airflow respectively passing through the first set of cooling fins.

25. The system of claim 23, wherein the second set of cooling fins is thermally coupled to the heat source by one or more heat pipes.

\* \* \* \* \*